United States Patent
Ohtani et al.

[11] Patent Number: 6,124,602
[45] Date of Patent: *Sep. 26, 2000

[54] SEMICONDUCTOR CIRCUIT HAVING A CRYSTAL GROWTH IN AN ACTIVE LAYER WHERE A SPECIFIC DISTANCE IS ESTABLISHED BETWEEN A SELECTED PORTION AND WHERE THE GROWTH STARTS TO THE ACTIVE LAYER OF THE CIRCUIT

[75] Inventors: Hisashi Ohtani; Jun Koyama; Yasushi Ogata, all of Kanagawa; Shunpei Yamazaki, Tokyo, all of Japan

[73] Assignee: Semiconductor Energy Laboratory Co., Ltd., Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/998,969
[22] Filed: Dec. 29, 1997
[30] Foreign Application Priority Data Dec. 30, 1996 [JP] Japan ................................ 8-358953

[51] Int. Cl.$^7$ ..................................................... H01L 29/00
[52] U.S. Cl. .................. 257/59; 257/72; 257/64; 257/65; 257/66; 257/70; 257/75; 257/347; 257/351; 438/150; 438/308; 438/486; 438/487
[58] Field of Search .................................. 257/59, 72, 64, 257/65, 66, 70, 75, 351, 347; 438/150, 308, 486, 487

[56] References Cited

U.S. PATENT DOCUMENTS

| 5,315,132 | 5/1994 | Yamazaki | 257/347 |
| 5,808,321 | 9/1998 | Mitanaga et al. | 257/64 |
| 5,814,835 | 9/1998 | Makita et al. | 257/65 |

*Primary Examiner*—Fetsum Abraham
*Attorney, Agent, or Firm*—Fish & Richardson P.C.

[57] ABSTRACT

In a semiconductor circuit using a silicon film in which crystals grow in the direction parallel to a substrate, the distance between the position of a starting region of crystal growth and the position of the respective active layers are made the same. Thus, the difference of the characteristics due to the difference of the distance of crystal growth is corrected.

36 Claims, 8 Drawing Sheets

SEMICONDUCTOR CIRCUIT HAVING A CRYSTAL GROWTH IN AN ACTIVE LAYER WHERE A SPECIFIC DISTANCE IS ESTABLISHED BETWEEN A SELECTED PORTION AND WHERE THE GROWTH STARTS TO THE ACTIVE LAYER OF THE CIRCUIT

BACKGROUND OF THE INVENTION

1. Field of the Invention

The present invention relates to a circuit using thin-film semiconductor devices having crystallinity.

2. Description of the Related Art

There has been known such a semiconductor device that a thin silicon film is formed on a glass substrate or a quartz substrate and the silicon film is used. In recent years, there has been developed a technique in which a silicon film is crystallized by heat or laser so that the device using the crystallized silicon film can be operated at high speed.

In a semiconductor device of polycrystalline silicon crystallized by heat, a heat treatment at a relatively high temperature such as 800° C., 900° C. or more is used. Thus, a quartz substrate which can withstand the above high temperature is used as a substrate.

In the technique of using laser for crystallization, thermal damage to a substrate hardly occurs, so that a glass substrate can be used.

In the present circumstances, TFTs are used to integrate an active matrix circuit and a peripheral drive circuit of an active matrix type liquid crystal display device on the same substrate. That is, it is practiced that the active matrix circuit and the peripheral drive circuit are formed on the same substrate by using the TFTs.

Also, in addition to the peripheral drive circuit (constituted by a shift resistor circuit, a buffer circuit, or the like), it has been considered to integrate an oscillation circuit, a D/A converter, an A/D converter, and a digital circuit for various kinds of image processing on the same substrate.

In the case where such various circuits are constituted, there is required a circuit structure in which the characteristics of paired thin-film transistors must strictly coincide with each other, such as a differential circuit.

Also, in a CMOS circuit (circuit in which a P-channel type thin-film transistor and an N-channel type thin-film transistor are complementarily constituted), it is preferable that the characteristic of the P-channel type thin-film transistor can possibly coincide with that of the N-channel type thin-film transistor.

However, if the P-channel type thin-film transistor and the N-channel type thin-film transistor are fabricated with the same structure and dimensions, the mobility of the N-channel type thin-film transistor is larger than the P-channel type thin-film transistor by about 30 to 50%.

Accordingly, when the CMOS circuit is operated at high frequency, there occurs an event that the balance of operation is lost between the P-channel type thin-film transistor and the N-channel type thin-film transistor.

SUMMARY OF THE INVENTION

An object of the present invention is therefore to provide a technique to correct the difference of characteristics of thin-film transistors, which is required by a circuit described above.

According to an aspect of the present invention, a semiconductor circuit comprises a plurality of semiconductor devices each having an active layer of a crystalline silicon film formed on a substrate having an insulating surface, and is characterized in that the crystalline silicon film constituting the active layer has a crystal structure in which crystals grow in the direction parallel to the substrate from a predetermined region, and the distance between the predetermined region and the active layer constituting each of the semiconductor devices is the same or substantially the same among the respective semiconductor devices.

According to another aspect of the present invention, a semiconductor circuit comprises a P-channel type thin-film transistor and an N-channel type thin-film transistor which are complementarily combined with each other, and is characterized in that an active layer constituting the respective thin-film transistors is constituted by a crystalline silicon film formed on a substrate having an insulating surface, the crystalline silicon film constituting the active layer has a crystal structure in which crystals grow in the direction parallel to the substrate from a predetermined region, and when a distance between the active layer constituting the P-channel type thin-film transistor and the predetermined region is $L_1$, and a distance between the active layer constituting the N-channel type thin-film transistor and the predetermined region is $L2$, $L_1$ is different from $L_2$.

In the above structure, when the characteristic of the P-channel type thin-film transistor and the characteristic of the N-channel type thin-film transistor are required to match to each other, $L_1$ is made less than $L_2$ ($L_1 < L_2$).

According to a still another aspect of the present invention, a semiconductor circuit comprises a P-channel type thin-film transistor and an N-channel type thin-film transistor which are complementarily combined, and is characterized in that an active layer constituting the respective thin-film transistors is constituted by a crystalline silicon film formed on a substrate having an insulating surface, the crystalline silicon film constituting the active layer has a crystal structure in which crystals grow in the direction parallel to the substrate from a predetermined region, and when a distance between the active layer constituting the P-channel type thin-film transistor and the predetermined region is $L_1$, and a distance between the active layer constituting the N-channel type thin-film transistor and the predetermined region is $L_2$, $L_1$ is made different from $L_2$ so that the difference of characteristics of both the thin-film transistors is corrected.

According to a still another aspect of the present invention, a semiconductor circuit comprises at least two thin-film transistors which are required to have the same characteristics, and is characterized in that an active layer constituting the respective thin-film transistors is constituted by a crystalline silicon film formed on a substrate having an insulating surface, the crystalline silicon film constituting the active layer has a crystal structure in which crystals grow in the direction parallel to the substrate from a predetermined region, and the distance between the active layer and the predetermined region is made the same among the respective thin-film transistors so that the difference of characteristics of the respective thin-film transistors is corrected.

In the above structure, with respect to the distance between the active layer and the predetermined region, the dispersion of the distance between an end of the predetermined region and the center of a channel formation region formed in the active layer is within ±10%, more preferably within ±5% among the respective semiconductor devices or thin-film transistors.

DETAILED DESCRIPTION OF THE PREFERRED EMBODIMENT

A thin-film transistor (TFT) used in the present invention uses a semiconductor in which crystals laterally grow in parallel to a substrate by a metal element for promoting crystallization. The present invention uses the TFT in which the flow of electric current from a source region in the semiconductor layer via a channel region to a drain region during an operation of the TFT is formed along the direction of crystal growth.

By using such a TFT, it becomes possible to constitute a circuit required to handle the high speed operation. The metal element for promoting crystallization in the present invention is one kind or plural kinds of elements selected from the group consisting of Fe, Co, Ni, Ru, Rh, Pd, Os, Ir, Pt, Cu and Au.

Figure 1:
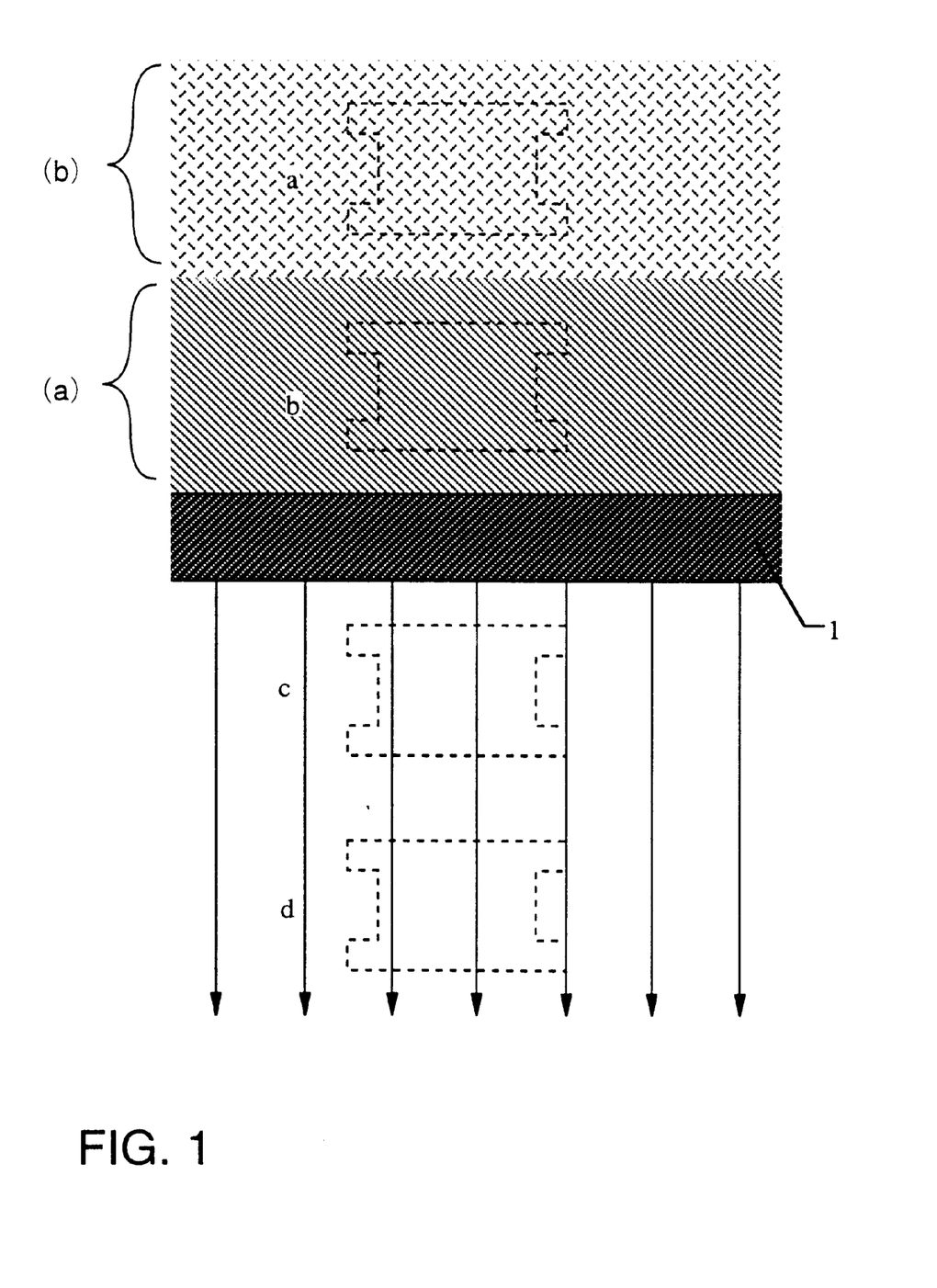
FIG. 1 is a top view showing crystal growth due to a metal element.

FIG. 1 is a schematic top view showing crystallization by the metal element for promoting crystallization. In FIG. 1, reference numeral 1 denotes a metal element added region. By adding the metal element in a band-shaped region as shown in the drawing, the growth direction of crystallization can be aligned as indicated by arrows.

However, in the case where it is attempted to obtain a plurality of TFTs by using semiconductors in which crystals grow from the metal element added region 1, crystal grains grow densely in a region (a) close to the added region 1, and crystal grains are coarse in a region (b) distant from the added region since the region is close to a critical point of crystal growth.

Thus, characteristics of TFTs obtained in the semiconductor layers "b" and "c" formed in the close region (a) are different from those of TFTs obtained in the semiconductor layers "a" and "d" formed in the distant region (b). In general, the characteristics of TFTs obtained in the semiconductor layers "b" and "c" formed in the region (a) close to the metal element added region are superior to those of TFTs obtained in the semiconductor layers "a" and "d" formed in the distant region (b).

However, in the region too close to the metal element added region, since the metal element exists in high concentration, it is considered that the characteristic becomes inferior on the contrary. The critical point of growth is changed by altering the concentration of the added metal element or by altering conditions such as a time and temperature of crystallization.

Here, the critical point of growth means a terminal point of crystallization due to the metal element when there is no obstacle in the growth region as shown in FIG. 1. Incidentally, in the critical point of growth, the metal element exists in higher concentration than other growth region. Thus, it is generally designed to remove the critical point of growth all together at patterning.

In FIG. 1, the distance between the semiconductor "a" or "d" and the closest metal element added region 1 is different from the distance between the semiconductor "b" or "c" and the closest metal element added region 1. In order to use the thus formed semiconductors "a", "b", "c" and "d" in one circuit, it is necessary to design the circuit in consideration of the difference of the characteristics.

When the semiconductors "a" and "b" are combined, and the semiconductors "c" and "d" are combined for use, it is conceivable to use the semiconductors in a circuit in which the difference of the characteristics is not problematic, such as an inverter circuit.

Also, by using the difference of the characteristics, a P-type impurity having a low mobility is added into the semiconductors "b" and "c" having superior characteristics, and an N-type impurity having a large mobility is added into the semiconductors "a" and "d" having inferior characteristics.

Then a CMOS circuit is formed by combining the semiconductors "a" and "b", and by combining the semiconductors "c" and "d". By doing so, it is possible to correct the difference between the characteristic of the P-channel type thin-film transistor and that of the N-channel type thin-film transistor constituting the CMOS circuit.

However, in designing the CMOS circuit, it is necessary to determine the conditions in consideration of the fact that the difference between the characteristic of the semiconductor "a" or "d" and that of the semiconductor "b" or "c" becomes large according to various conditions such as the concentration of the metal element, added region and temperature of crystallization.

Figure 2:
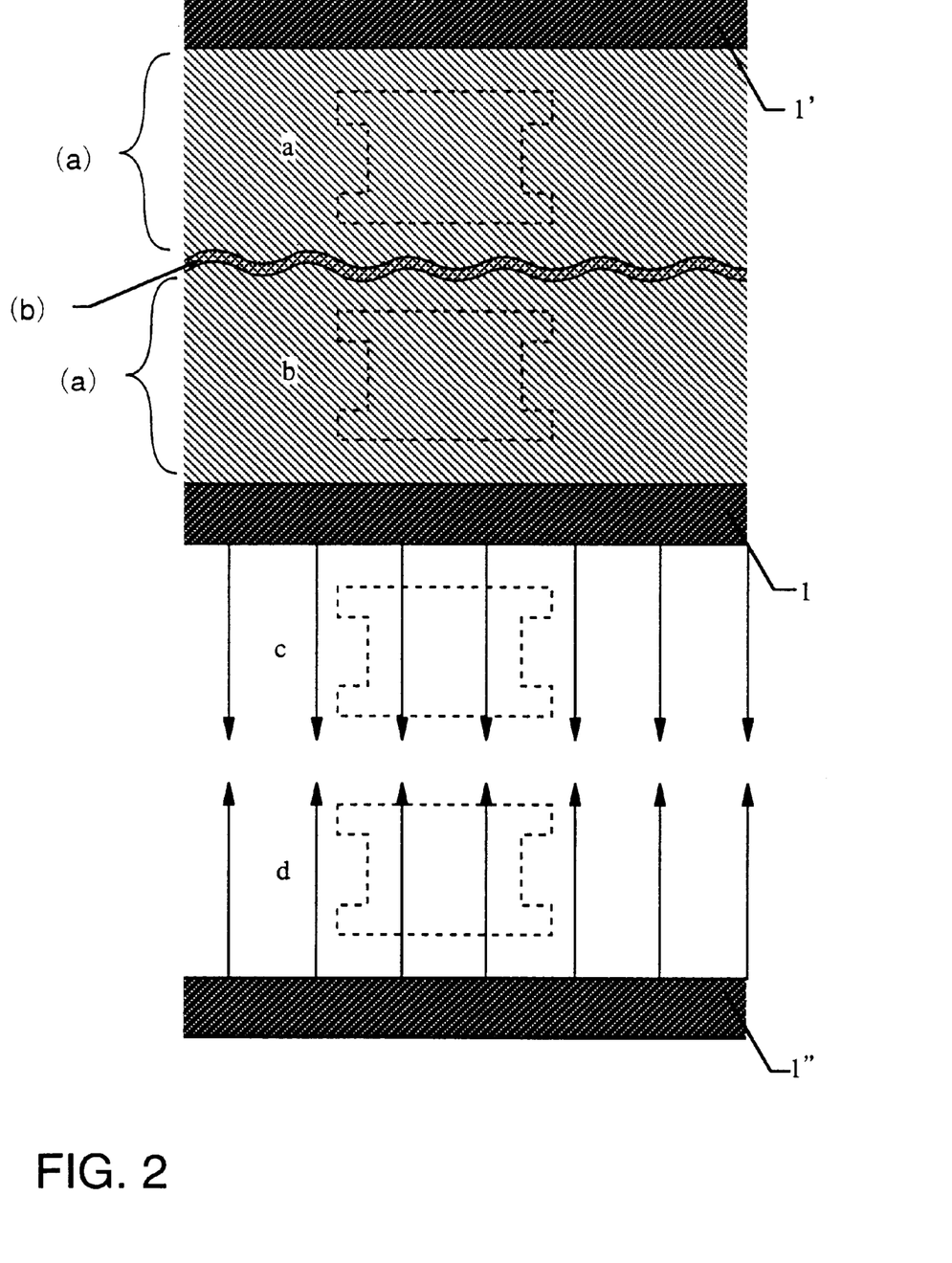
FIG. 2 is a top view showing crystal growth due to a metal element.

In the case where uniform TFT characteristics are required for the semiconductors "a", "b", "c" and "d", a metal element is added into, for example, regions 1, 1' and 1" as shown in FIG. 2. Here, the added region 1' is arranged such that the distance between the added region 1' and the semiconductor "a" is made equal to the distance between the semiconductor "b" or "c" and the added region 1. Similarly, the added region 1' is arranged such that the distance between the added region 1' and the semiconductor "d" is made equal to the distance between the semiconductor "b" or "c" and the added region 1.

That is, in FIG. 2, the distance between the semiconductor "a" and the closest metal element added region 1', the distance between the semiconductor "b" or "c" and the closest metal element added region 1, and the distance between the semiconductor "d" and the closest metal element added region 1" are made equal to each other.

By making such an arrangement, crystals grow as indicated by arrows in the drawing, and the semiconductors "a", "b", "c" and "d" have the same TFT characteristics.

Such an arrangement is effective when it is used for a differential amplifying circuit or the like which is required to make the characteristics of paired thin-film transistors coincide with each other.

Here, it should be noted that a region (c) in the drawing is a grain boundary formed by collision between crystal growth from the added region 1 and crystal growth from the added region 1'. In this grain boundary (c), since the direction of crystal growth is irregular and the concentration of the metal element is relatively high, it should be avoided, to the maximum degree, to use the grain boundary as the semiconductor of the TFT. Incidentally, although not shown in the drawing, a grain boundary is also formed between the semiconductors "c" and "d".

If a circuit is formed by using the thus formed semiconductors "a", "b", "c" and "d", it is possible to constitute a circuit in which the characteristics of all semiconductors are even. That is, it becomes possible to output the same waveform for the same input waveform.

Figure 3:
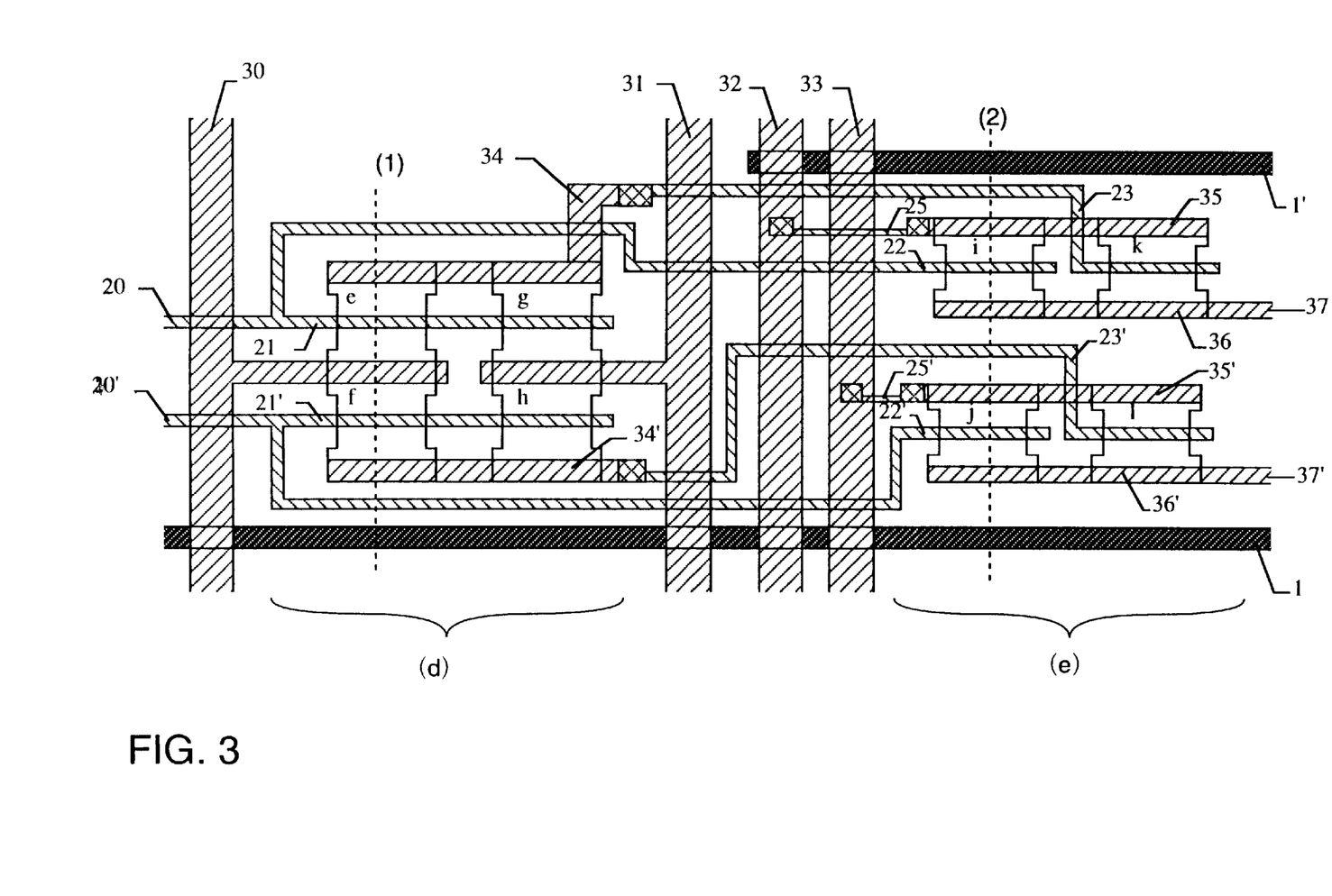
FIG. 3 is a view showing a mask pattern of one of structures of the present invention.
Figure 4:
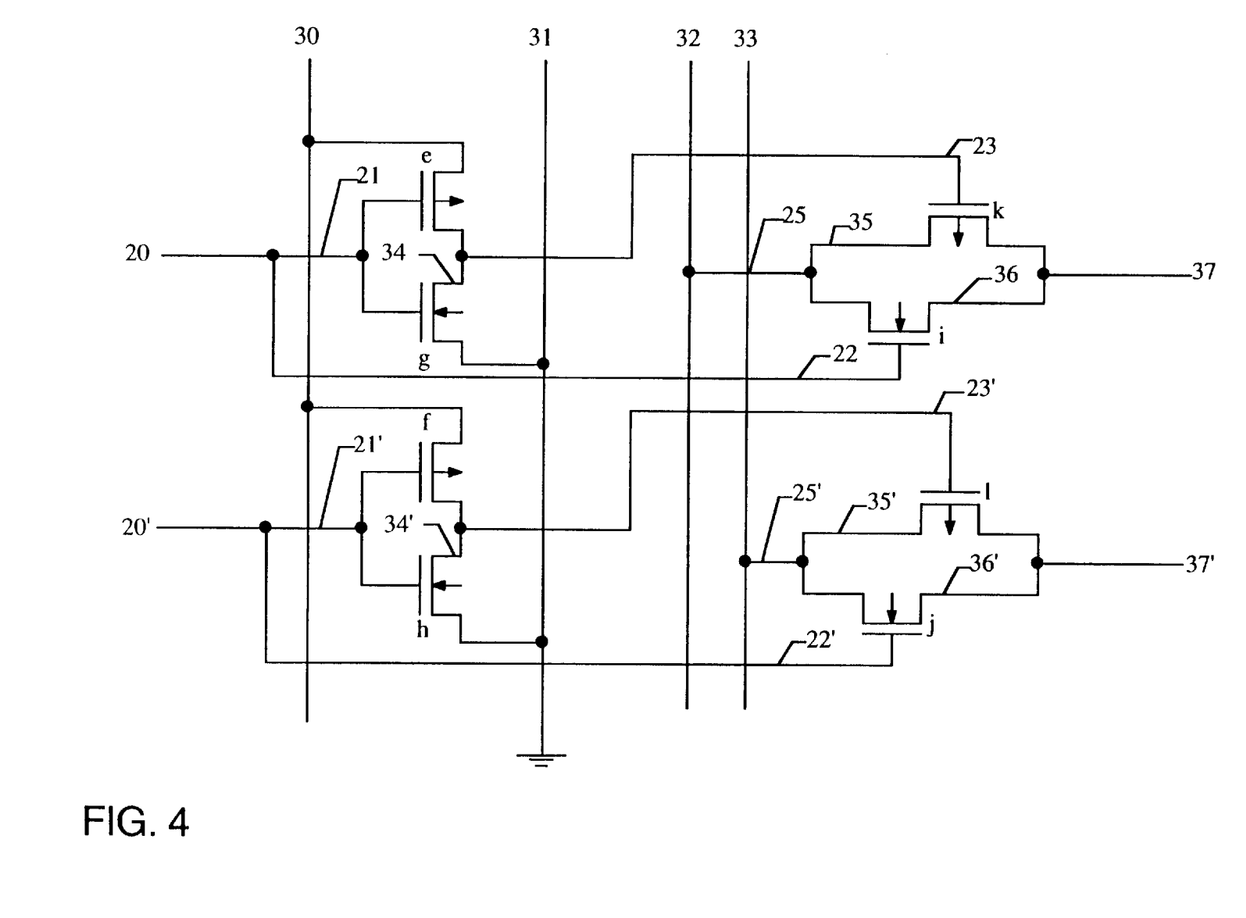
FIG. 4 is a view showing an equivalent circuit of FIG. 3.

FIG. 3 shows a mask pattern in a preferred embodiment of the present invention. Here, an inverter circuit (d) and an analog switch circuit (e) for constituting a part of a source driver circuit of an active matrix type display device are formed at the same time. FIG. 4 shows an equivalent circuit thereof.

As shown in FIGS. 3 and 4, in the inverter circuit (d), two combinations of a P-type semiconductor "e" and an N-type semiconductor "g", and a P-type semiconductor "f" and an N-type semiconductor "h" are formed. Likewise, in the analog switch circuit, two combinations of an N-type semiconductor "i" and a P-type semiconductor "k", and an N-type semiconductor "j" and a P-type semiconductor "l" are formed.

A circuit constituted by the semiconductors "e" and "g" of the inverter circuit (d) is connected to a circuit constituted by the semiconductors "i" and "k" of the analog switch (e).

Likewise, a circuit constituted by the semiconductors "f" and "h" of the inverter circuit (d) is connected to a circuit constituted by the semiconductors "j" and "l" of the analog switch (e).

In FIG. 3, reference numerals 1 and 1' denote metal element added regions, respectively. The semiconductors "e", "f", "g" and "h" have a crystal structure in which crystal growth has proceeded in the direction perpendicular to the added region 1.

Thus, also as shown in FIG. 1, the characteristic of the crystalline semiconductor "e" or "g" is different from the characteristic of the semiconductor "f" or "h", and the characteristics of the semiconductor "f" and "h" are superior to the characteristics of the semiconductors "e" and "g".

However, since mutual uniformity of TFT characteristics is not particularly required between the inverter circuit formed of the semiconductors "e" and "g" and the inverter circuit formed of the semiconductors "f" and "h", it is sufficient to provide only the added region 1.

However, in the analog switch circuit (e), uniformity is required for the TFT characteristics of the crystalline semiconductors "i" and "j", and "k" and "l". Thus, a metal element added region 1' is formed close to the semiconductors "i" and "k". By forming the added region 1' in this way, the distance between the semiconductor "i" or "k" and the metal element added region 1' is made equal to the distance between the semiconductor "j" or "l" and the metal element added region 1. The two metal element added regions 1 and 1' contribute to crystallization. That is, the TFT characteristic of the semiconductor "i" or "k" can be made equal to the TFT characteristic of the semiconductor "j" or "l".

As to the distance between the metal element added region and the semiconductor, the distance between the metal element added region and the center of a region which finally becomes a channel formation region is made a reference. In a plurality of semiconductor devices which are required to have even characteristics, it is desired that the dispersion of the distance among the respective semiconductor devices is within ±10%, more preferably within ±5%. Of course, if the allowable error of required characteristics is large, it is not necessary to satisfy this condition.

In the circuit shown in FIG. 4, input signals inputted from wiring lines 20 and 20' are inverted by an inverter circuit (d). The signals are inputted into gates of semiconductor devices of the silicon films "k" and "l" through wiring lines 23 and 23'. Also, input signals from the wiring lines 20 and 20' are inputted through the wiring lines 22 and 22' into gates of semiconductor devices of the silicon films "i" and "j".

In this way, when an input signal is in a high potential, the analog switch circuit (e) turns on, so that a signal of a video signal line 32 is outputted from a wiring line 37 through wiring lines 25, 35 and 36 to a source line. Also, a signal of a video signal line 33 is outputted from a wiring line 37' through wiring lines 25', 35' and 36' to the source line.

Next, manufacturing steps of this circuit will be described.

Incidentally, the metal element added region does not exist in the final state of a circuit. However, the position of this region can be distinguished by the following reason.

That is, a semiconductor at a region where a metal element has been added is alloyed, so that the region is etched at a faster rate than other region at etching. Thus, there is obtained such a state that a part of the surface of an under substrate is shaved. Therefore, it is possible to judge that the region (recess portion) where a part of the under substrate is etched, is a region where the metal element was introduced.

The present invention will next be described in more detail in relation to preferred embodiments.

EMBODIMENT 1

In embodiment 1, one of manufacturing methods of the structure shown in FIG. 3 will be described. FIGS. 5A to 5D and 6E to 6I are views showing manufacturing steps of a section taken along line (1) in FIG. 3. FIGS. 7A to 7D and 8E to 8I are views showing manufacturing steps of a section taken along line (2) in FIG. 3.

Figure 5A:
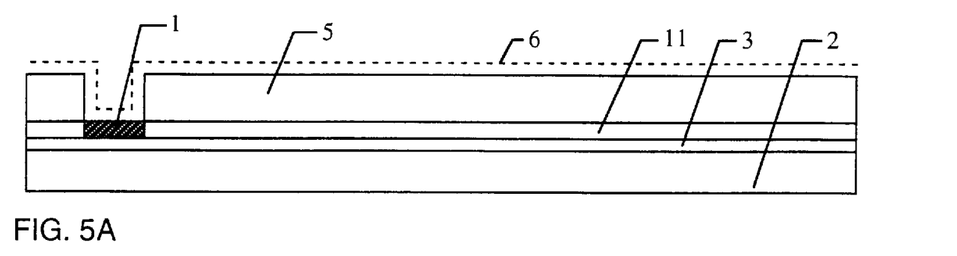
FIGS. 5A to 5D are views showing manufacturing steps of a section (1) of FIG. 3.
Figure 7A:
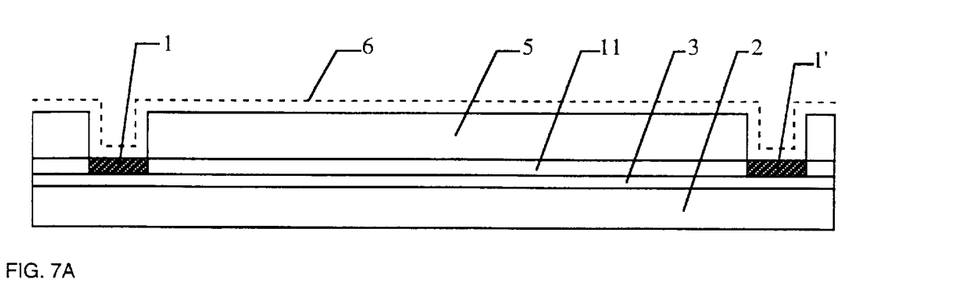
FIGS. 7A to 7D are views showing manufacturing steps of a section (2) of FIG. 3.

First, a silicon oxide film with a thickness of 3,000 Å is grown, as an under film 3, on a quartz substrate 2 shown in FIGS. 5A and 7A. If the smoothness of the surface of the quartz substrate is good and cleaning is sufficiently carried out, this under layer 3 is not necessarily needed.

As the substrate, in the current circumstances, it is preferable selection to use the quartz substrate. However, as long as a substrate can withstand the temperature of a heat treatment, the substrate is not limited to quartz.

Next, an amorphous silicon film 11 with a thickness of 500 Å, as a starting film of a crystalline silicon film, is grown by a low pressure thermal CVD method.

Next, a not-shown silicon oxide film with a thickness of 1,500 Å is grown, and is patterned to form a mask 5. The mask is provided with openings at positions corresponding to a metal element added region 1 in FIG. 5A and metal element added region 1 and 1' in FIG. 7A. The amorphous silicon film 11 is exposed at the regions where the openings are formed.

The respective metal element added regions 1 and 1' have a slender rectangle with a longitudinal direction from this side to a depth side of the drawing. It is suitable to make the width of this metal element added regions 1 and 1' 20 μm or more. The length of the regions in the longitudinal direction is made a required length.

The distance between the metal element added regions 1 and 1' shown in FIG. 7A is designed in consideration of the formation of TFTs therebetween and their margins. In general, since the length of crystal growth is 50 to 200 μm, the distance is selected at a value in the range of 80 to 300 μm. In this embodiment, the distance is 100 μm.

Then a nickel acetate solution containing a nickel element of 10 ppm in weight is coated. A superfluous solution is removed by spin dry using a not-shown spinner. The amount of introduced nickel element can be controlled by the concentration of nickel element contained in the above solution.

In this way, there is obtained a state in which the nickel element exists in the state as indicated by a dotted line 6 in FIGS. 5A and 7A. In this state, there is obtained a state in which the nickel element is selectively brought into contact with a part of the amorphous silicon film and is held in the metal element added regions 1 and 1'.

The nickel element may be introduced by an ion implantation method. In this case, as compared with the coating method of the solution containing the nickel element, the introduced position of the nickel element can be controlled more accurately. Thus, the implantation method is especially effective in the case where the width of the introduced region of the nickel element is very narrow, for example, several μm or less, or the shape of the introduced region is complicated.

Next, in a nitrogen atmosphere containing hydrogen of 3% and containing oxygen as little as possible (or in a nitrogen atmosphere), a heat treatment at 500 to 630° C., for example, at 600° C. for eight hours is carried out. Then crystal growth in the direction parallel to the substrate 2 proceeds as shown by arrows in FIGS. 5B and 7B.

Figure 5B:
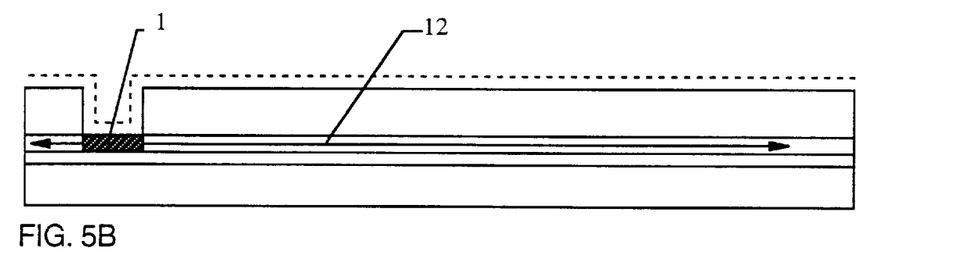
Figure 7B:
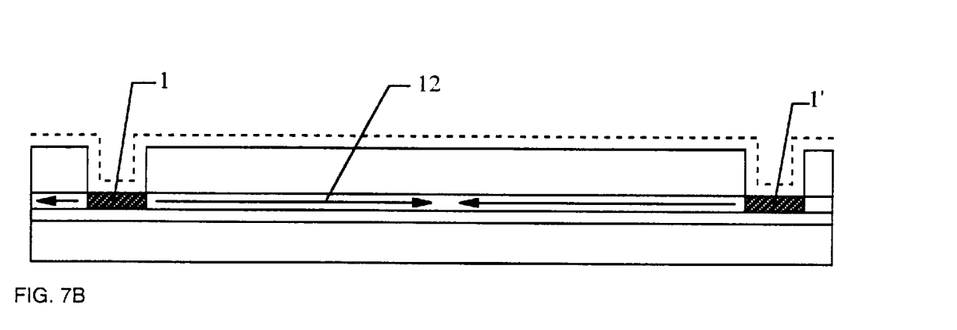

This crystal growth proceeds from the metal element added region 1 and 1' where the nickel element has been introduced, toward the circumference. The crystal growth in the direction parallel to the substrate is called side growth or lateral growth.

The surface of the crystalline silicon film of lateral growth obtained by this crystal growth is extremely superior in smoothness as compared with a conventional low temperature polysilicon or a high temperature polysilicon. It is considered that the smoothness is obtained since the directions of extension of crystal grain boundaries are substantially aligned.

The surface roughness of a normal polycrystalline silicon or a silicon film called polysilicon is ±100 Å or more. However, in the case where lateral growth is made as in this embodiment, it is observed that the surface roughness is not larger than ±30 Å. The roughness deteriorates the characteristics of an interface between a silicon film and a gate insulating film, so that it is preferable that the roughness can possibly be small.

In the heat treatment condition for the above crystallization, this lateral growth can be carried out over 100 μm. In this way, silicon films 12 and 12' having lateral growth regions are obtained.

The heat treatment for the crystal growth can be carried out at a temperature of 450° C. to 1,100° C. (the upper limit is restricted by heat resistance of the substrate). In order to assure some degree of lateral growth distance, it is preferable to make the temperature of the heat treatment 600° C. or more. However, even if the temperature is raised any more, the improvement of the distance of crystal growth or crystallinity is not so large. (Thus, in view of cost and simplification of steps, it is sufficient to carry out a heat treatment at a temperature of 600° C. to 650° C.)

Then the mask 5 of silicon oxide film for selectively introducing the nickel element is removed.

In this state, the nickel element is unevenly distributed in the film. Especially, the nickel element of relatively high concentration exists in the metal element added regions 1 and 1', their neighborhood, and tip portion of the crystal growth.

Thus, it is important to avoid those regions in the formation of an active layer. That is, it is important to make the state that the active layer does not include a region where the nickel element is unevenly distributed. In order to achieve the state, it is required that the active layer and the metal element added region are separated from each other by at least 10 μm.

In the crystalline silicon film 12' in FIG. 7B, since grain boundaries formed by collision of crystals are formed in the proximity of the center thereof, when the semiconductors "i" and "j" are patterned, it is necessary to provide a margin of at least 10 μm therebetween.

After the crystallization, laser beam irradiation may be carried out. That is, crystallization may be further promoted by the irradiation of laser beam. The irradiation of laser beam has an effect to disperse the agglomeration of the nickel element existing in the film so that the nickel element is easily removed later. Even if the laser beam irradiation is carried out at this stage, the lateral growth does not further proceed.

As the laser beam, an excimer laser having a wavelength of ultraviolet region may be used. For example, a KrF excimer laser (wavelength 248 nm) or a XeCl excimer laser (wavelength 308 nm) may be used.

Figure 5C:
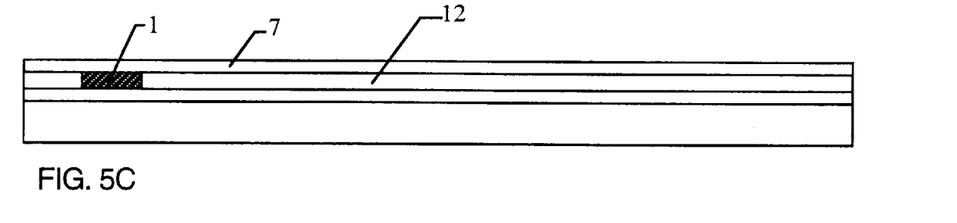
Figure 7C:
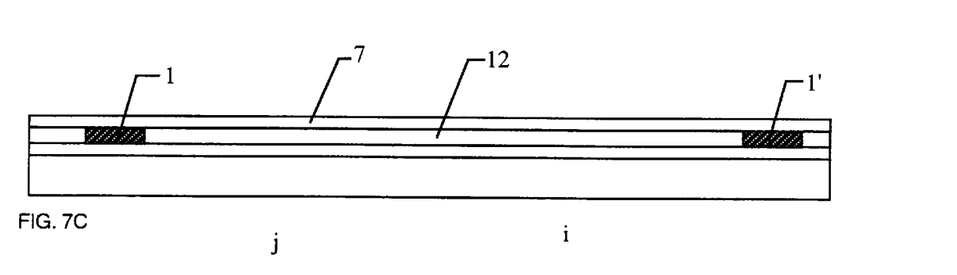

Next, in an oxygen atmosphere containing a halogen element, for example, in an oxygen atmosphere containing HCl of 3 vol %, a heat treatment at a temperature of 950° C. is carried out to form a thermal oxidation film 7 with a thickness of 200 Å (FIGS. 5C and 7C).

In the above step, as the thermal oxidation film is formed, the silicon element having unstable bonding state in the film is used for the formation of the thermal oxidation film. Then defects in the film are decreased and higher crystallinity can be obtained.

At the same time, by the formation of the thermal oxidation film 7 and the operation of chlorine, gettering of the nickel element in the film is carried out. In this step, a small amount of chlorine is added also into the silicon films 12 and 12'.

Of course, a relatively high concentration of nickel element is taken in the thermal oxidation film. Then the nickel element in the silicon films 12 and 12' is relatively decreased. In this way, the states shown in FIGS. 5C and 7C are obtained. After the thermal oxidation film 7 is formed, the thermal oxidation film 7 is removed. In this way, the crystalline silicon films 12 and 12' where the concentration of nickel element is decreased, is obtained.

The crystalline silicon film 12 obtained in FIG. 5C has a structure in which crystal structure extends in one direction (this direction coincides with the direction of crystal growth) as shown in FIG. 1. That is, the crystalline silicon film has such a structure that a plurality of slender cylindrical crystal bodies are arranged side by side in parallel with each other through a plurality of crystal boundaries extending in one direction. The crystal is densely formed in the region close to the metal element added region, and the crystal is relatively coarsely formed in the region far from the metal element added region.

The crystalline silicon film 12' obtained in FIG. 7C has a structure that by the collision of two crystal growth regions as shown in FIG. 2, a dense crystal region uniformly exists in the greater part of the film. That is, the silicon film 12' has uniform crystallinity in the region except portions extremely close to the metal element added region 1 and 1', and except the grain boundaries formed by the collision of crystal growth regions.

Next, patterning is carried out to form a pattern of lateral growth region. An island region 13 in FIG. 5D becomes an active layer of semiconductors "e" and "f" later. An island region 113 in FIG. 7D becomes an active layer of a semiconductor "i", and an island region 113' becomes an active layer of a semiconductor "j" later.

Here, a pattern is positioned so that the direction connecting a source region to a drain region is made coincident or substantially coincident with the direction of crystal growth. By doing so, it is possible to align the direction in which a carrier moves and the direction in which a crystal lattice continuously extends. As a result, a high performance TFT can be obtained.

Figure 5D:
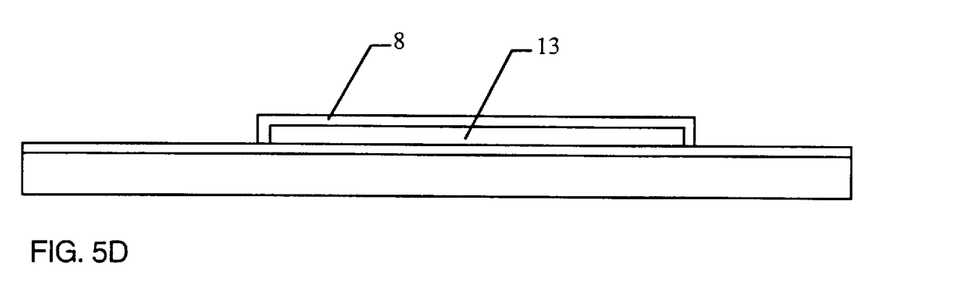
Figure 7D:
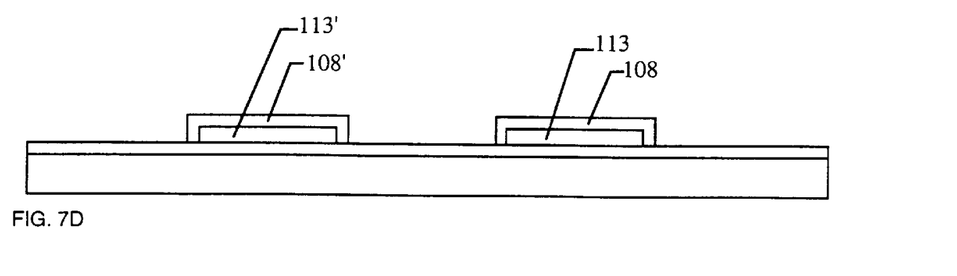

After forming the patterns 13, 113 and 113', thermal oxidation films 8, 108 and 108' with a thickness of 300 Å are grown. These thermal oxidation films are obtained by carrying out a heat treatment at 950° C. in an oxygen atmosphere containing HCl of 0.1 to 10 vol %, for example, 3 vol %.

Also in this step, similar effects to the case where the thermal oxidation film 7 is grown, can be obtained. Incidentally, the thermal oxidation films 8, 108 and 108' become part of gate insulating films of TFTs.

Figure 6E:
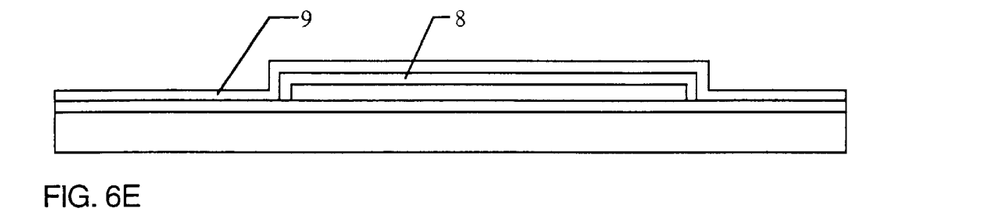
FIGS. 6E to 6I are views showing manufacturing steps of the section (1) of FIG. 3.
Figure 8E:
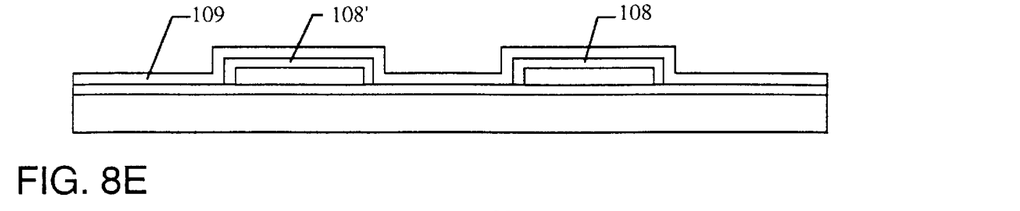
FIGS. 8E to 8I are views showing manufacturing steps of the section (2) of FIG. 3.

Thereafter, silicon oxide films 9, 109 and 109' with a thickness of 1,000 Å, which constitute gate insulating films together with the thermal oxidation films 8, 108 and 108', are grown by a plasma CVD method (FIGS. 6E and 8E).

In this embodiment, the thermal oxidation films 8, 108 and 108' are formed in advance. However, it is also possible to select a method in which after the patterns 13, 113 and 113' are formed, a silicon oxide film is formed by a plasma CVD method, and then a heat treatment is carried out to form a thermal oxidation film between the silicon oxide film and a silicon film. If this method is selected, it is possible to decrease an interface level at an interface between the gate insulating film and the silicon film.

Although the concentration of nickel finally remaining in the silicon film is about $1 \times 10^{14}$ to $5 \times 10^{18}$ atoms/cm$^3$ in the present circumstances, the lower the better. If the gettering condition of the thermal oxidation film is controlled, the upper limit of the concentration can be decreased to about $5 \times 10^{17}$ atoms/cm$^3$. This concentration can be measured by using SIMS (Secondary Ion Mass Spectrometry).

Next, an aluminum film with a thickness of 4,000 Å for forming a gate electrode is grown by a sputtering method. Scandium of 0.2 wt % is made to be contained in this aluminum film.

The reason why scandium is contained in the aluminum film is to suppress the occurrence of hillocks and whiskers in a subsequent step. The hillocks and whiskers are needle-like protrusions caused by abnormal growth of aluminum at heating.

As a material for forming a gate electrode, tantalum (Ta), polysilicon doped with a large amount of phosphorus (P), silicide of tungsten (WSi), or a mixture of polysilicon doped with phosphorus and silicide of tungsten may be used other than aluminum.

After the aluminum film is grown, a not-shown dense anodic oxidation film is formed. This anodic oxidation film is formed by anodic oxidation using an ethylene glycol solution containing tartaric acid of 3% as an electrolytic solution, the aluminum film as an anode, and platinum as a cathode. In this step, the anodic oxidation film with a thickness of 100 Å and having dense film quality is grown on the aluminum film.

This not-shown anodic oxidation film functions to improve adhesiveness to a resist mask formed later.

The film thickness of the anodic oxidation film can be controlled by an applied voltage at the anodic oxidation.

Figure 6F:
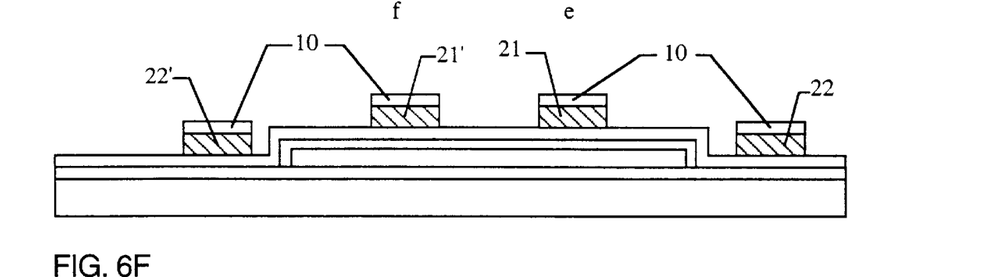
Figure 8F:
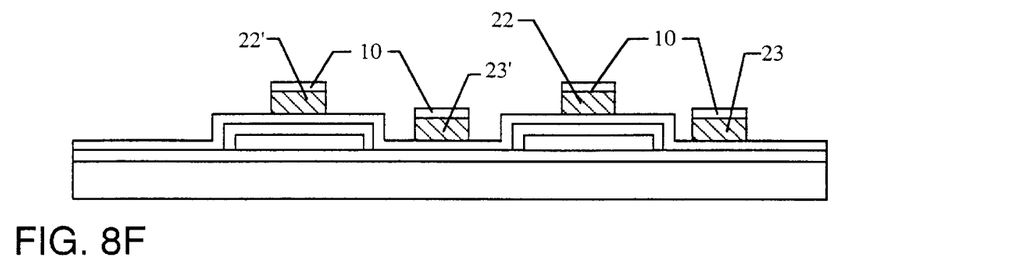

Next, a resist mask 10 is formed. By using this resist mask, the aluminum film is patterned into patterns 21, 21', 22, 22', 23 and 23' as shown in FIGS. 6F and 8F.

Here, anodic oxidation is again carried out. In this embodiment, an aqueous solution of oxalic acid of 3% is used as an electrolytic solution. In this electrolytic solution, anodic oxidation using the aluminum patterns 21, 21', 22, 22', 23 and 23' as an anode is carried out, so that a porous anodic oxidation film 18 is formed.

In this step, since the resist mask 10 having high adhesiveness exists at the upper portion, the anodic oxidation film 18 is selectively formed on the side of the aluminum pattern.

This anodic oxidation film can be grown to have a film thickness of several $\mu$m. In this embodiment, the film thickness is made 6,000 Å. The growth distance can be controlled by an anodic oxidation time.

Then the resist mask 10 is removed. Next, a dense anodic oxidation film is again formed. That is, anodic oxidation using the ethylene glycol solution containing tartaric acid of 3% as an electrolytic solution is again carried out.

Figure 6G:
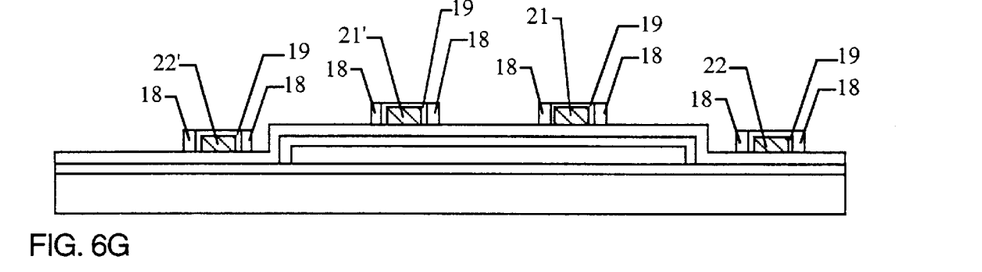
Figure 8G:
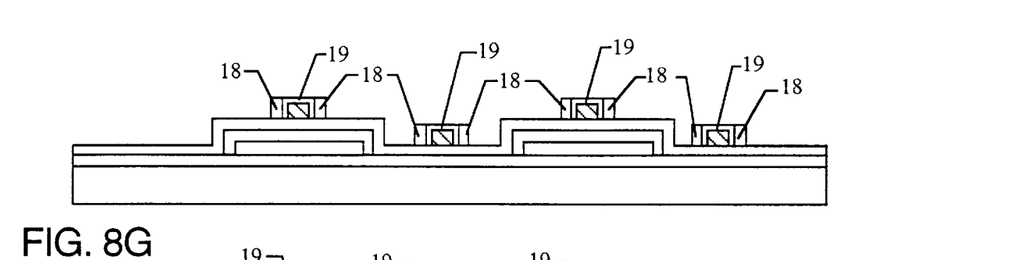

In this step, since the electrolytic solution permeates into the porous anodic oxidation film 18, an anodic oxidation film having dense film quality as denoted by 19 is formed.

The film thickness of the dense anodic oxidation film 19 is made 1,000 Å. The control of the film thickness is carried out by an applied voltage (FIGS. 6G and 8G).

Here, the exposed silicon oxide films 9, 109 and 109' are etched. At the same time, the thermal oxidation films 8, 108 and 108' are etched. This etching is carried out by using dry etching. The porous anodic oxidation film 18 is removed by using a mixed acid of acetic acid, nitric acid and phosphoric acid.

Next, impurity ions are implanted. Here, N-channel type thin-film transistors are fabricated from the semiconductors "i" and "j" in FIG. 8, and P-channel type thin-film transistors are fabricated from the semiconductors "e" and "f" in FIG. 6.

For the above purpose, a not-shown resist mask is formed on the semiconductors "e" and "f" in FIG. 6 to prevent addition of P (phosphorus) ions. In this state, implantation of P ions is carried out to the entire surface by a plasma doping method.

In this step, there are formed heavily doped regions 114, 114', 115 and 115', and lightly doped regions 117 and 117' in the semiconductors "i" and "j". This is because the remaining silicon oxide film 109 functions as a semitransparent mask, so that a part of the implanted ions is blocked by the film.

Next, the resist mask formed on the semiconductors "e" and "f" is removed. Then a resist mask is formed on the semiconductors "i" and "j". Then B (boron) ions are implanted by a plasma doping method to fabricate a P-channel type thin-film transistor.

Here, since the resist mask is formed on the semiconductors "i" and "j", the implantation of B ions can be prevented.

In this step, there are formed heavily doped regions 14, 15 and 15', and lightly doped regions 17 and 17'. This is because the remaining silicon oxide film 9 functions as a semitransparent mask, so that a part of the implanted ions is blocked by the film.

Then, by carrying out the irradiation of laser beam (or intense light using a lamp), activation of the region where the impurity ions have been implanted is carried out.

Figure 6H:
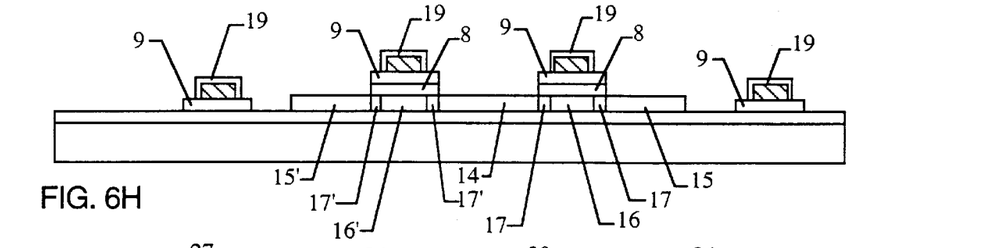

In this way, a channel formation region 16, a P-type drain region 15, a low concentration impurity region 17, and a common source region 14 to the semiconductor "f" are formed in a self aligning manner in the semiconductor "e". Also, a channel formation region 16', a P-type drain region 15', a low concentration impurity region 17', and a common source region 14' to the semiconductor "e" are formed in a self aligning manner in the semiconductor "f" (FIG. 6H).

Figure 8H:
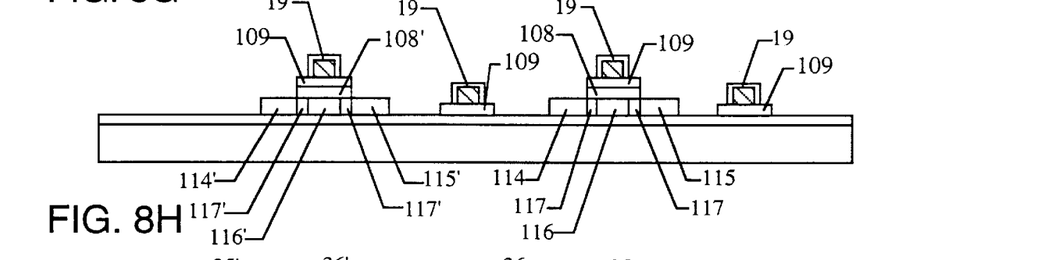

Similarly, a channel formation region 116, an N-type source region 114, a drain region 115, and a low concentration impurity region 117 are formed in a self aligning manner in the semiconductor "i". Also, a channel formation region 116', an N-type source region 114', a drain region 115', and a low concentration impurity region 117' are formed in a self aligning manner in the semiconductor "j" (FIG. 8H).

In the case where the film thickness of the dense anodic oxidation film 19 is made thick, for example, more than 2,000 Å, an offset gate region can be formed at the outside of the channel formation regions 16, 16', 116 and 116' by the film thickness.

Also in this embodiment, the offset gate region is formed. However, the dimension thereof is small so that the contribution due to its existence is small. Further, depiction of the offset gate region complicates the drawings. Thus, the offset gate region is not shown in the drawings.

In order to thickly form the anodic oxidation film with the dense film quality so as to have such a thickness as 2,000 Å or more, an applied voltage exceeding 200 V is required, so that attention must be paid for reproducibility and safety.

Next, a silicon oxide film, silicon nitride film, or a laminated film thereof is formed as an interlayer insulating film 27. A layer of a resin material on the silicon oxide film or the silicon nitride film may be used as the interlayer insulating film.

Figure 6I:
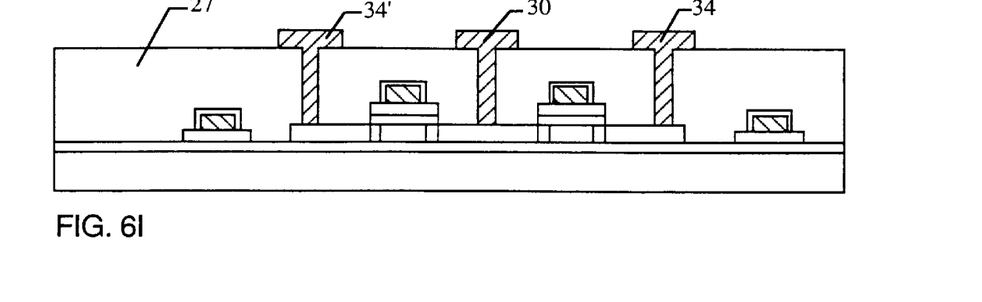

Then, contact holes are formed, and a drain electrode 34 for the semiconductor "e", a source electrode 30 common to the semiconductor "f", and a drain electrode 34' of the semiconductor "f" are formed. In this way, a thin-film transistor as shown in FIG. 6I is completed.

Figure 8I:
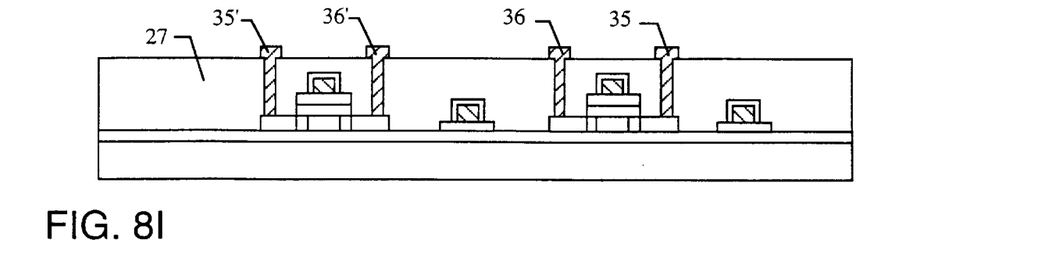

Similarly, in FIG. 8I, a drain electrode 35 and a source electrode 36 for the semiconductor "i", and a drain electrode 35' and a source electrode 36' for a semiconductor "j" are formed.

The TFT obtained in this embodiment has very high performance which has not been conventionally obtained.

For example, in an NTFT (N-channel type TFT), there is obtained such high performance that the mobility is 200 to 300 (cm$^2$/Vs) and S-value is 75 to 90 (mV/dec)($V_D$=1V). In a PTFT (P-channel type TFT), there is obtained such high performance that the mobility is 120 to 180 (cm$^2$/Vs) and S-value is 75 to 100 (mV/dec)($V_D$=1V). In this case, the channel length (the width of gate electrode on the active layer) L is 0.6 μm.

These TFTs enable the operation of 1 GHz at the level of a ring oscillator, and 100 MHz at the level of a shift resistor, when a voltage of a drive signal is 3.3 to 5 V.

The thin-film transistor using the crystalline silicon film having the above described unique crystal structure has a feature that a short channel effect hardly occurs due to the crystal structure. Also, since an insulator is used as the substrate, the thin-film transistor has also a feature that it has no problem of capacitance of a substrate and is suitable for high speed operation.

In a conventional MOS transistor using a single crystal silicon wafer, there is a so-called scaling law. This is such a low that if a dimension of a transistor is made small in accordance with a predetermined law, performance of the transistor is increased in accordance with a predetermined law.

However, in the recent circumstances in which miniaturization is greatly progressed, it becomes difficult to improve the performance of a transistor in accordance with this scaling law. For example, the shorter the channel length is made to suppress the short channel effect, the more difficult the manufacturing steps become, since a delicate step such as doping at a side of a channel is required.

However, in the case where the crystalline silicon film having the above described unique crystal structure is used, a required characteristic can be obtained with a dimension which does not follow the above scaling law.

It is considered that this is achieved through the following factors:

(1) The short channel effect is suppressed by making the extending direction of cylindrical crystal bodies coincident with the direction in which carries move in a channel;

(2) The problem of capacitance is greatly suppressed by using an insulator as a substrate; and (3) Aluminum can be used as a gate electrode so that high speed operation can be advantageously achieved.

The factor (1) is considered as follows. That is, the cylindrical crystal structure bodies are separated by inactive crystal grain boundaries into the respective ones, and the energy level in this crystal grain boundaries is high, so that the movement of carriers is restricted in the direction of extension of crystal bodies. Also, by a similar way of thinking, the extension of depletion layer from source and drain regions to the inside of a channel is suppressed. It is conceivable that this suppresses the short channel effect.

As a concrete example which does not follow the above scaling law, the following examples are exemplified.

For example, while the thickness of a gate insulating film must be 100 Å conventionally in accordance with the scaling law, in the case where the crystalline silicon film as disclosed in the present specification is used, the same characteristic can be obtained even if the thickness of the gate insulating film is 300 Å. As a result, the characteristic of static electricity resistance can be improved.

This is understood by the factors (1) to (3) described above.

Also, in addition to the film thickness of the gate insulating film, also with respect to the channel length, a predetermined characteristic can be obtained with a looser condition (condition lower by one rank) than a conventional scaling law.

This is useful in the case where a semiconductor circuit capable of performing high speed operation is fabricated over a large area at low cost.

In the TFT disclosed in this embodiment, when the channel length L is made 0.35 μm, the drivable maximum frequency (cut off frequency) is expected to be higher than the case of the channel length L=0.6 μm by a factor of about four, and than the case of the channel length L=2 μm by a factor of about fifty.

This embodiment is merely one example of the present invention. The present invention is not limited to this manufacturing method. Also, the circuit shown in FIGS. 3 and 4 is merely one example of the present invention. As long as a circuit follows the subject matter disclosed in the present specification, a circuit is not limited to a specific circuit.

EMBODIMENT 2

In this embodiment, laser beam irradiation is combined with crystal growth by a metal element.

In the manufacturing steps of this embodiment, the condition of the heat treatment shown in FIG. 5B is 600° C. for eight hours, and the laser beam irradiation is carried out to the crystalline silicon film obtained after the heat treatment.

Formation of a thermal oxidation film by a heat treatment at a high temperature after the laser irradiation is not carried out. In this case, since the highest process temperature is made 600° C., a glass substrate can be used as a substrate.

EMBODIMENT 3

In this embodiment, in the case where active layers "a" to "d" are formed in the positional relation as shown in FIG. 1, the layer "a" is made an active layer of an N-channel type thin-film transistor, and the layer "b" is made an active layer of a P-channel type thin-film transistor. The two thin-film transistors are complementarily constituted.

By doing so, it is possible to make such a structure that the mobility is decreased for the N-channel type thin-film transistor, and the mobility is raised for the P-channel type thin-film transistor. As a result, it is possible to suppress the difference between the characteristics of the two thin-film transistors.

EMBODIMENT 4

In this embodiment, the structure in the embodiments 1 to 3 is constituted by a reverse stagger type thin-film transistor. Even if a planer type thin-film transistor shown in the embodiment 1 is changed into the reverse stagger type thin-film transistor, similar effects can be obtained.

Incidentally, it is effective, in obtaining high performance thin-film transistor, to use a material having high heat resistance, for example, polysilicon doped with a large amount of phosphorus, as a gate electrode of the reverse stagger type thin-film transistor.

As described above, by using the semiconductor disclosed in the present specification, it becomes possible to fabricate a high performance circuit which has not been obtained by a conventional thin-film transistor.

Also, by using the difference in crystallinity due to the difference of distance from a region where a metal element has been added, it becomes possible to uniform the characteristics of thin-film transistors having different conductivities.

The present invention can be used not only for constituting a peripheral circuit formed on the same substrate as an active matrix circuit in a transmission type or reflection type active matrix liquid crystal display device, but also for constituting a display device using an EL (electro luminescence) element, and other various circuits using thin-film transistors.

What is claimed is:

1. An analog switching circuit comprising a plurality of semiconductor devices each having an active layer of a crystalline semiconductor film formed over a substrate having an insulating surface, wherein the crystalline semiconductor film constituting the active layer has a crystal structure in which crystals grow in a direction parallel to the substrate from a selected portion not formed in the active layer, and wherein a distance between the selected portion and the active layer constituting the respective semiconductor devices is the same or substantially the same for each of the respective semiconductor devices, wherein dispersion of the distance between an end of the selected portion and a center of a channel formation region formed in the active layer is within ±10% among the respective semiconductor device.

2. An analog switching circuit as claimed in claim 1, wherein dispersion of the distance between an end of the selected portion and a center of a channel formation region formed in the active layer is within ±5% among the respective semiconductor devices.

3. The analog switching circuit of claim 1, wherein said circuit forms portions of a source driver in an active matrix display.

4. An electro-luminescence display unit using at least one analog switching circuit according to claim 1.

5. An analog switching circuit according to claim 1 wherein the selected portion is a portion where a material for promoting crystallization of a semiconductor film has been added to said semiconductor film.

6. An inverter circuit comprising a P-channel type thin-film transistor and an N-channel thin film transistor which are complementarily combined, wherein an active layer constituting the respective thin-film transistor is constituted by a crystalline semiconductor film formed over a substrate having an insulating surface, wherein the crystalline semiconductor film constituting the active layer has a crystal structure in which crystals grow in a direction parallel to the substrate from a selected portion not formed in the active layer, and wherein when a distance between the active layer constituting the P-channel type thin-film transistor and the selected portion is L1, and a distance between the active layer constituting the N-channel type thin-film transistor and the selected portion is L2, L1 is different from L2.

7. An inverter circuit as claimed in claim 6, wherein L1<L2.

8. The inverter circuit of claim 6, wherein said circuit forms portions of a source driver in an active matrix display.

9. An electro-luminescence display unit using at least one inverter circuit according to claim 6.

10. An inverter circuit according to claim 6 wherein the selected portion is a portion where a material for promoting crystallization of a semiconductor film has been added to said semiconductor film.

11. An inverter circuit comprising a P-channel type thin-film transistor and an N-channel type thin-film transistor which are complementarily combined, wherein an active layer constituting the respective thin-film transistors is constituted by a crystalline semiconductor film formed over a substrate having an insulating surface, wherein the crystalline semiconductor film constituting the active layer has a crystal structure in which crystals grow in a direction parallel to the substrate from a selected portion not formed in the active layer, and wherein when a distance between the active layer constituting the P-channel type thin-film transistor and the selected portion is L1, and a distance between the active layer constituting the N-channel type thin-film transistor and the selected portion is L2, L1 is made different from L2 so that difference of characteristics of both the thin-film transistors is corrected.

12. The inverter circuit of claim 11, wherein said circuit forms portions of a source driver in an active matrix display.

13. An electro-luminescence display unit using at least one inverter circuit according to claim 11.

14. An inverter circuit according to claim 11 wherein the selected portion is a portion where a material for promoting crystallization of a semiconductor film has been added to said semiconductor film.

15. An analog switching circuit comprising at least two thin-film transistors which are required to have the same characteristics,
    wherein an active layer constituting the respective thin-film transistors is constituted by a crystalline semiconductor film formed over a substrate having an insulating surface,
    wherein the crystalline semiconductor film constituting the active layer has a crystal structure in which crystals grow in a direction parallel to the substrate from a selected portion not formed in the active layer, and
    wherein a distance between the selected portion and the active layer is made the same or substantially the same for each of the respective thin-film transistors, so that difference of characteristics of the respective thin-film transistors is corrected,
    wherein dispersion of the distance between an end of the selected portion and a center of a channel formation region formed in the active layer is within ±10% among the respective semiconductor device.

16. An analog switching circuit as claimed in claim 15, wherein dispersion of the distance between an end of the selected portion and a center of a channel formation region formed in the active layer is within ±5% among the respective thin-film transistors.

17. The analog switching circuit of claim 15, wherein said circuit forms portions of a source driver in an active matrix display.

18. An electro-luminescence display unit using at least one analog switching circuit according to claim 15.

19. An analog switching circuit according to claim 15 wherein the selected portion is a portion where a material for promoting crystallization of a semiconductor film has been added to said semiconductor film.

20. A differential amplifying circuit comprising a plurality of semiconductor devices each having an active layer of a crystalline semiconductor film formed over a substrate having an insulating surface,
    wherein the crystalline semiconductor film constituting the active layer has a crystal structure in which crystals grow in a direction parallel to the substrate from a selected portion not formed in the active layer, and
    wherein a distance between the selected portion and the active layer constituting the respective semiconductor devices is the same or substantially the same for each of the respective semiconductor devices,
    wherein dispersion of the distance between an end of the selected portion and a center of a channel formation region formed in the active layer is within ±10% among the respective semiconductor device.

21. A differential amplifying circuit as claimed in claim 20, wherein dispersion of the distance between an end of the selected portion and a center of a channel formation region formed in the active layer is within ±5% among the respective semiconductor devices.

22. An electro-luminescence display unit using at least one differential amplifying circuit according to claim 20.

23. A differential amplifying circuit according to claim 20 wherein the selected portion is a portion where a material for promoting crystallization of a semiconductor film has been added to said semiconductor film.

24. A differential amplifying circuit comprising at least two thin-film transistors which are required to have the same characteristics,
    wherein an active layer constituting the respective thin-film transistors is constituted by a crystalline semiconductor film formed over a substrate having an insulating surface,
    wherein the crystalline semiconductor film constituting the active layer has a crystal structure in which crystals grow in a direction parallel to the substrate from a selected portion not formed in the active layer, and
    wherein a distance between the selected portion and the active layer is made the same or substantially the same for each of the respective thin-film transistors, so that difference of characteristics of the respective thin-film transistors is corrected,
    wherein dispersion of the distance between an end of the selected portion and a center of a channel formation region formed in the active layer is within ±10% among the respective semiconductor device.

25. A differential amplifying circuit as claimed in claim 24, wherein dispersion of the distance between an end of the selected portion and a center of a channel formation region formed in the active layer is within ±5% among the respective thin-film transistors.

26. An electro-luminescence display unit using at least one differential amplifying circuit according to claim 24.

27. A differential amplifying circuit according to claim 24 wherein the selected portion is a portion where a material for promoting crystallization of a semiconductor film has been added to said semiconductor film.

28. An inverter circuit which comprises at least an N-channel type thin film transistor and a P-channel type thin film transistor, said inverter circuit formed by a method comprising the steps of:
    forming a semiconductor film over a substrate having an insulating surface;
    providing a selected portion of said semiconductor film with a material for promoting crystallization of said semiconductor film;
    crystallizing said semiconductor film wherein crystal grows from said selected portion through said semiconductor film;
    patterning the crystallized semiconductor film into at least first and second semiconductor islands;
    forming said N-channel type thin film transistor and said P-channel type thin film transistor using said first and second semiconductor islands as at least a channel region thereof;
    wherein a first distance between said selected potion and the channel region in said P-channel type thin film transistor is different from a second distance between said selected portion and the channel region in said N-channel type thin film transistor.

29. An inverter circuit according to claim 28 wherein said first distance is shorter than said second distance.

30. An electro luminescence display unit using at least one inverter circuit according to claim 28.

31. An analog switching circuit which comprises at least two thin film transistors, said analog switching circuit formed by a method comprising a steps of:

forming a semiconductor film over a substrate having an insulating surface;

providing at least first and second selected portions of said semiconductor film with a material for promoting crystallization of said semiconductor film respectively;

crystallizing said semiconductor film wherein crystal grows from said selected portion through said semiconductor film;

patterning the crystallized semiconductor film into at least first and second semiconductor islands;

forming said first and second thin film transistors having at least first and second channel regions respectively thereof by using said first and second semiconductor islands;

wherein a first distance between said first selected potion and said first channel region in said first thin film transistor is the same or substantially the same as a second distance between said second selected portion and said second channel region in said second thin film transistor, wherein dispersion of the distance between an end of the selected portion and a center of a channel formation region formed in the active layer is within ±10% among the respective semiconductor device.

32. An analog switching circuit according to claim 31 wherein dispersion of the distance between an end of each said first and second selected portion and a center of the respective first and second channel formation regions is within ±5% among the respective first and second thin film transistors.

33. An electro luminescence display unit using at least one analog switching circuit according to claim 32.

34. A differential amplifying circuit which comprises at least two thin film transistors, said differential amplifying circuit formed by a method comprising a steps of:

forming a semiconductor film over a substrate having an insulating surface; providing at least first and second selected portions of said semiconductor film with a material for promoting crystallization of said semiconductor film respectively;

crystallizing said semiconductor film wherein crystal grows from said selected portion through said semiconductor film;

patterning the crystallized semiconductor film into at least first and second semiconductor islands;

forming said first and second thin film transistors having at least first and second channel regions respectively thereof by using said first and second semiconductor islands;

wherein a first distance between said first selected potion and said first channel region in said first thin film transistor is the same or substantially the same as a second distance between said second selected portion and said second channel region in said second thin film transistors, wherein dispersion of the distance between an end of the selected portion and a center of a channel formation region formed in the active layer is within ±10% among the respective semiconductor device.

35. A differential amplifying circuit according to claim 34 wherein dispersion of the distance between an end of each said first and second selected portion and a center of the respective first and second channel formation regions is within ±5% among the respective first and second thin film transistors.

36. An electro luminescence display unit using at least one differential amplifying circuit according to claim 34.

* * * * *